United States Patent
Templin

(10) Patent No.: US 6,278,743 B1
(45) Date of Patent: *Aug. 21, 2001

(54) NON LINEAR AMPLITUDE PRECORRECTION FOR HDTV TRANSMITTER

(75) Inventor: Frank C. Templin, Arlington Heights, IL (US)

(73) Assignee: Zenith Electronics Corporation, Lincolnshire, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/745,549

(22) Filed: Nov. 12, 1996

(51) Int. Cl.[7] ................................................. H04L 25/03
(52) U.S. Cl. ......................... 375/296; 375/316; 348/495; 348/470
(58) Field of Search ................................ 375/296, 316; 348/428, 429, 426, 437, 438, 470, 723, 724, 183, 678; 330/52; 455/69, 126; 327/37

(56) References Cited

U.S. PATENT DOCUMENTS

| | | | | |
|---|---|---|---|---|
| 4,041,534 | * | 8/1977 | Chabanel | 348/723 |
| 4,449,061 | * | 5/1984 | Yasuda et al. | 327/37 |
| 4,670,789 | * | 6/1987 | Plume | 348/724 |
| 4,729,011 | * | 3/1988 | McCann | 348/183 |
| 4,885,551 | * | 12/1989 | Myer | 330/52 |
| 4,905,086 | * | 2/1990 | Tahara | 348/723 |
| 5,181,112 | * | 1/1993 | Citta et al. | 348/470 |
| 5,191,462 | * | 3/1993 | Gitlin et al. | 455/126 |
| 5,396,190 | * | 3/1995 | Murata | 330/149 |
| 5,404,378 | * | 4/1995 | Kimura | 375/296 |
| 5,565,932 | * | 10/1996 | Citta et al. | 348/678 |
| 5,574,994 | * | 11/1996 | Huang et al. | 455/126 |
| 5,602,595 | * | 2/1997 | Citta et al. | 348/495 |
| 5,740,520 | * | 4/1998 | Cyze et al. | 455/69 |
| 5,770,971 | * | 6/1998 | McNicol | 330/52 |

OTHER PUBLICATIONS

Karam et al., A Data Predistortion Technique with Memory for QAM Radio System, IEEE, vol. 39, No. 2, pp. 336–344, Feb. 1991.*

Levy et al., Adapation of a digital predistortion technique based on intersymbol interpolation, IEEE, pp. 145–150, May 1995.*

* cited by examiner

Primary Examiner—Stephen Chin
Assistant Examiner—Shuwang Liu

(57) ABSTRACT

A circuit for developing correction signals for on-line controlling a precorrection arrangement in an HDTV 8VSB digital signal transmitter. The transmitted signal is sampled, sorted, smoothed and sliced to determine the symbol amplitude levels of the transmitted multilevel symbols. The centers of the sliced clusters of sampled symbol levels are used to determine the symbol amplitude levels. Correction signals for compensating the precorrection arrangement are developed based upon the determined symbol levels and the known symbol levels.

24 Claims, 1 Drawing Sheet

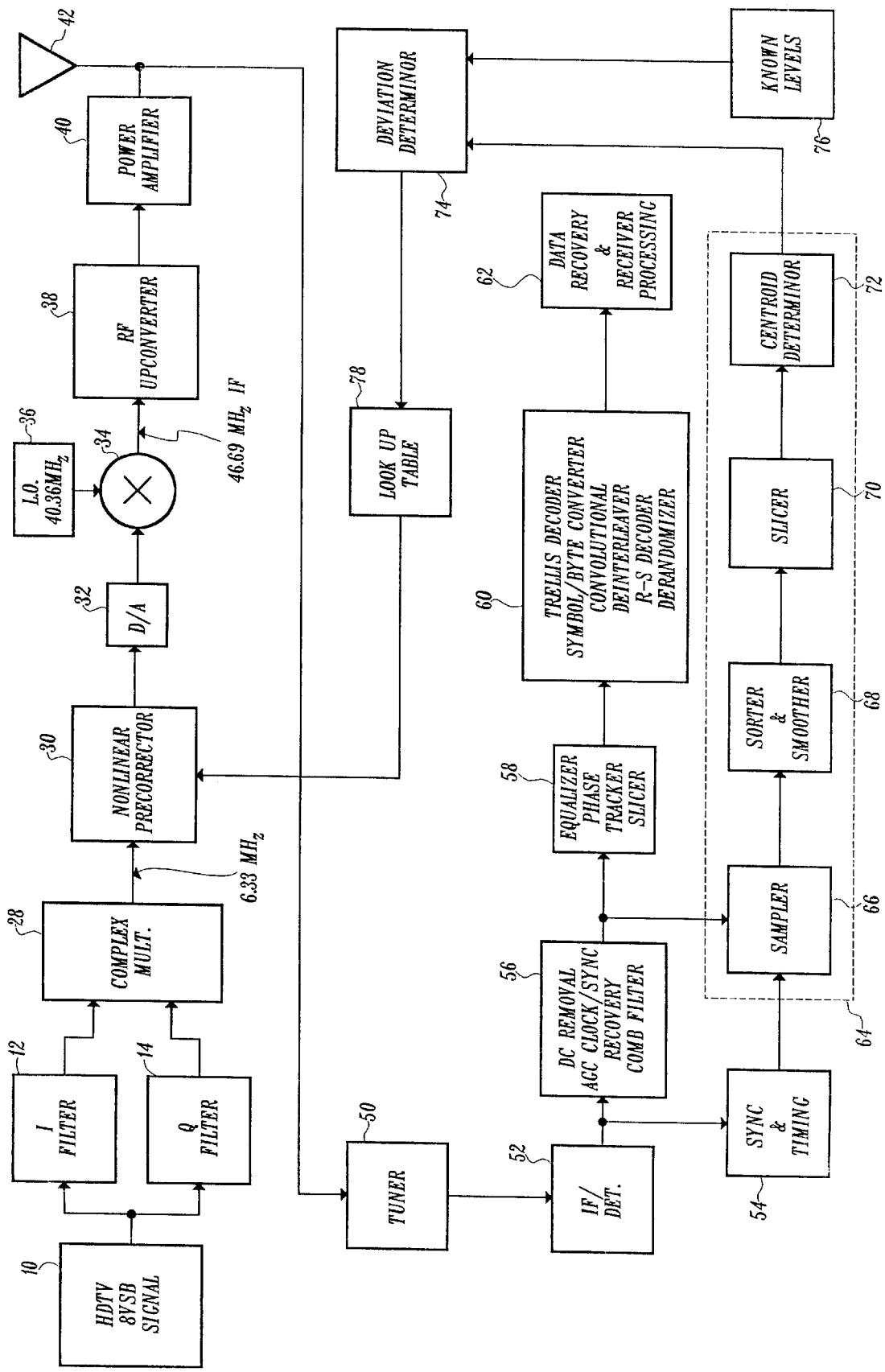

NON LINEAR AMPLITUDE PRECORRECTION FOR HDTV TRANSMITTER

BACKGROUND OF THE INVENTION AND PRIOR ART

This invention relates generally to transmitters and in particular to transmitters that are used to transmit digital HDTV signals.

Television transmitters generally use vacuum tube amplifiers because of their very large power handling ability. Vacuum tube amplifiers have a non linear operating characteristic, which causes signal distortion, especially at high power levels, which are the most efficient levels for the transmitter operators. For conventional NTSC analog transmissions, the distortion is generally tolerable and it is not unusual to operate such vacuum tube amplifiers at a 60 kilowatt level. In most instances, an attempt is periodically made to minimize the effects of the distortion caused by the power amplifier by sampling the output of the transmitter while transmitting a known training signal and manually performing corrective measures on the transmitter IF amplifier to compensate for distortions introduced into the training signal. This is a trial and error approach which is time consuming and highly dependent upon the skill of the technician. It also must be repeated periodically and is generally done "off-line", i.e. when the transmitter is off the air. This is highly inconvenient for continuous transmitters.

With the imminent advent of HDTV television signal broadcasting, the distortion problem has taken on much greater significance. The newly adopted digital HDTV signal is an 8VSB signal consisting of multilevel symbols. When such a signal is processed by state of the art vacuum tube power amplifier tubes, the operating signal power is on the order of −12 dB from the normal 60 kilowatt level for NTSC signals. This power limitation is necessary because of the impairment suffered by the digital signal in non linear transmitters operating near the 60 kilowatt level, and results in severe operating inefficiencies for the transmitter operator and a significant curtailment of the transmission range of the HDTV signal. The distortion introduced is also non linear in that the gain of the amplifier changes with changes in input signal amplitude. Such distortion may be compensated by non linear precorrection of the input signal to offset the amplifier-introduced distortion.

The present invention is directed to developing an on-line correction signal for a non linear precorrector in the transmitter. The invention permits conventional transmitter power amplifiers to be operated with acceptable distortion at their normal 60 kilowatt levels with an HDTV 8VSB multilevel symbol digital television signal.

OBJECTS OF THE INVENTION

A principal object of the invention is to provide a novel technique for precorrecting non linear distortion in a transmitter power amplifier.

Another object of the invention is to provide an improved transmission system for digital television signals.

A further object of the invention is to provide a digital television transmitter with automatic on-line precorrection of signal distortion.

BRIEF DESCRIPTION OF THE DRAWINGS

These and other objects and advantages of the invention will be apparent from reading the following description thereof in conjunction with the drawing, the single FIGURE of which is a simplified block diagram illustrating the invention.

DESCRIPTION OF THE PREFERRED EMBODIMENT

The digital television signal recently adopted for use in the United States is an 8VSB multilevel symbol signal that consists of two fields of 313 data segments each, with each data segment being headed by a four symbol segment sync signal and the first segment of each field comprising a field data segment signal. There are eight equally spaced data levels for the symbols and distortion in the signal causes great difficulty in determining these symbol levels. Because of the nature of digital signals, it is essential that the symbol levels be recovered with minimum error. Non linear distortion at higher power levels is more of a problem with an 8VSB signal because the degradation in symbol level recovery occurs more abruptly as opposed to non linear distortion in an analog NTSC signal where the degradation is more gradual and causes fewer harmful effects on analog NTSC demodulation.

As mentioned above, the present invention is performed on-line and includes a technique for deriving correction information for application to a non linear precorrector in the transmitter.

Referring to the drawing, a source of 8VSB HDTV signal 10 supplies an I channel filter 12 and a Q channel filter 14, both, in turn, being coupled to a complex multiplier 28 that processes both the I and Q components of the signal. While the IF frequency supplied to the RF upconverter is 46.69 MHz, the digital processing is performed at a lower frequency, namely 6.33 MHz. The output of the complex multiplier 28 is supplied to a non linear precorrector 30, which is a controllable amplifier, the gain of which is related to a correction signal. The output of the precorrector 30 is supplied to a D/A (digital-to-analog) converter 32 where the signal is converted to analog form and applied to a multiplier 34 that is also supplied with a 40.36 MHz local oscillator signal for generating the desired 46.69 MHz IF signal. The IF signal is supplied to an RF up-converter 38 which produces the desired channel output signal. This signal is applied to a power amplifier 40, which as discussed above, comprises a high powered vacuum tube amplifier that has a typical non linear distortion curve. The power amplifier 40 supplies a transmitting antenna 42, and a suitable tap on the transmitter supplies the output signal to an HDTV receiver that includes a tuner 50 and an IF/detector 52. The demodulated signal from IF/detector 52 is applied to a block 56 that may include a DC removal circuit, an AGC circuit, clock/sync recovery circuitry and a comb filter. The signal from block 56 is supplied to a block 58 that includes an equalizer, a phase tracker and a slicer. The output of block 58 is coupled to a block 60 that includes a trellis decoder, a symbol/byte converter, a convolutional deinterleaver, an R-S decoder and a derandomizer, all of which are well known in the digital VSB transmission and receiving system. The output of block 60 is supplied to a block 62 that provides data recovery and further receiver processing.

A sync and timing block 54 develops appropriate timing signals from the demodulated signal from IF/detector 52 and supplies a sampler circuit 66 that samples the demodulated signal. The output of sampler 66 is supplied to a sorter and smoother 68. In the preferred embodiment, about 32,000 samples of the demodulated signal are taken or captured from the input of the equalizer in block 58. These samples provide a distribution of data that clusters around the amplitude levels of the 8VSB signal. The samples are placed in 10 bit, two's complement form and sorted in ascending order from −512 to +511. A histogram of the sorted data would show a statistical clustering around the eight peaks that are defining the 8VSB levels. In practice, the x variable ranges from about −300 to about +300 and the Y variable ranges from 0 to about 4000 to show the number of samples at each point in the x variable range. A "shell" sort technique may be used to sort the individual data. The smoothing function that is applied to the sorted data smooths the rough or noisy edges that appear on the distribution of the data. A technique that may be employed is to take a moving average of the sorted data.

The sorted and smoothed data is supplied to a slicer 70. The slicing level for the samples is chosen so that the smoother regions of the peaks defining the 8VSB levels are above the slicing level. The sliced data is applied to a centroid determiner 72 which determines the center of each peak, which becomes the estimate of the 8VSB level for each peak. The output of the centroid determiner 72 is applied to a deviation determinor 74 that also receives an input from a known levels block 76. The output of deviation determiner 74 is applied to a look-up table 78 that supplies the correction information to non linear precorrector 30.

In practice, the eight "determined symbol levels" from centroid determiner 72 are essentially compared with the eight known symbol levels in the original 8VSB signal. Deviation determiner 74 accesses look-up table 78 that stores the necessary correction data for controlling the gain of non linear precorrector 30 to compensate for the non linear distortion effect of power amplifier 40 on the symbol levels of the 8VSB signal.

It will be appreciated by those skilled in the art that the levels of the 8VSB symbols are known and therefore, deviations from those levels in the demodulated signal may readily be determined so that correction signals for compensating for the deviations may be developed and applied to the precorrector. It is recognized that numerous changes in the described embodiment of the invention will occur to those skilled in the art without departing from its true spirit and scope.

What is claimed is:

1. A method of precorrecting for non-linear transmitter distortion comprising:
   receiving transmitted data;
   sorting the received data into clusters based upon amplitude;
   determining a plurality of received data levels from the data clusters;
   determining a precorrection quantity from the plurality of received data levels; and,
   precorrecting data to be transmitted based upon the precorrection quantity.

2. The method of claim 1 wherein the determining of a plurality of received data levels from the data clusters comprises:
   determining centroids of the data clusters; and,
   determining the plurality of received data levels from the centroids.

3. The method of claim 1 wherein the receiving of transmitted data comprises (i) demodulating the received data, and (ii) sampling the demodulated data to obtain data samples, wherein the sorting of the received data into clusters based upon amplitude comprises sorting the data samples into clusters based upon amplitude, and wherein the determining of a precorrection quantity from the plurality of received data levels comprises determining the plurality of received data levels from the sample clusters.

4. The method of claim 3 wherein the determining of the plurality of received data levels from the sample clusters comprises:
   determining centroids of the sample clusters; and,
   determining the plurality of received data levels from the centroids.

5. The method of claim 1 wherein the determining of a precorrection quantity from the plurality of received data levels comprises determining the precorrection quantity from at least three received data levels derived from the data clusters.

6. The method of claim 1 wherein the plurality of received data levels comprises a set of received data levels, and wherein the determining of a precorrection quantity from the plurality of received data levels comprises:
   comparing the set of received data levels to a set of non-transmitted reference data levels; and,
   determining the precorrection quantity from the comparison of the set of received data levels to the set of non-transmitted reference data levels.

7. The method of claim 1 wherein the data levels are peaks.

8. A method of precorrecting data to be transmitted in order to compensate for non-linear transmitter distortion comprising:
   receiving transmitted data, wherein the received data includes multilevel symbols;
   sorting the received multilevel symbols into clusters based upon amplitude;
   determining a set of received symbol levels from the symbol clusters;
   determining a precorrection quantity from the set of received symbol levels; and,
   precorrecting the data to be transmitted based upon the precorrection quantity.

9. The method of claim 8 wherein the determining of a set of received symbol levels from the symbol clusters comprises:
   determining centroids of the symbol clusters; and,
   determining the set of received symbol levels from the centroids.

10. The method of claim 8 wherein the receiving of transmitted data comprises (i) demodulating the received multilevel symbols, and (ii) sampling the demodulated multilevel symbols to obtain samples of the multilevel symbols, wherein the sorting of the received multilevel symbols into clusters based upon amplitude comprises sorting the samples of the received multilevel symbols into clusters based upon amplitude, and wherein the determining of a set of received symbol levels from the symbol clusters comprises determining the set of received symbol levels from the sample clusters.

11. The method of claim 10 wherein the determining of the set of received symbol levels from the sample clusters comprises:
   determining centroids of the sample clusters; and,
   determining the set of received symbol levels from the centroids.

12. The method of claim 8 wherein the determining of a precorrection quantity from the set of received symbol levels comprises:

comparing the set of received symbol levels to a set of reference symbol levels; and, determining the precorrection quantity from the comparison of the set of received symbol levels to the set of reference symbol levels.

13. The method of claim 8 wherein the symbol levels are peaks.

14. An apparatus to precorrect data to be transmitted in order to compensate for non-linear transmitter distortion comprising:

a processor arranged to determine a precorrection quantity based upon received data and non-transmitted reference slice thresholds, wherein the processor is arranged to sort the received data into clusters based upon amplitude and to determine the received slice thresholds from the data clusters, and wherein the processor is arranged to determine the precorrection quantity from the received slice thresholds and from the non-transmitted reference slice thresholds; and, a precorrector arranged to precorrect the data to be transmitted based upon the precorrection quantity.

15. The apparatus of claim 14 wherein the processor is arranged to determine centroids of the data clusters and to determine the received slice thresholds from the centroids.

16. The apparatus of claim 14 wherein the processor is arranged to demodulate the received data and to sample the demodulated data to obtain data samples, and wherein the processor is arranged to sort the data samples into clusters based upon amplitude and to determine the received slice thresholds from the sample clusters.

17. The apparatus of claim 16 wherein the processor is arranged to determine centroids of the sample clusters and to determine the received slice thresholds from the centroids.

18. The apparatus of claim 14 wherein the processor is arranged to compare the received slice thresholds to the non-transmitted reference slice thresholds in order to produce the precorrection quantity.

19. A method of precorrecting for non-linear transmitter distortion comprising:

receiving transmitted data;

determining a set of received data levels from the received data;

comparing the set of received data levels to a set of non-transmitted reference data levels;

determining a precorrection quantity from the comparison of the set of received data levels to the set of non-transmitted reference data levels, wherein no precorrection quantity is determined from a single data level; and, precorrecting data to be transmitted based upon the precorrection quantity.

20. The method of claim 19 wherein the receiving of transmitted data comprises sorting the received data into clusters, and wherein the determining of a set of received data levels from the received data comprises determining each received data level of the set of received data levels from a corresponding data cluster.

21. The method of claim 20 wherein the determining of each received data level of the set of received data levels from a corresponding data cluster comprises determining centroids of the data clusters.

22. The method of claim 19 wherein the receiving of transmitted data comprises (i) demodulating the received data, and (ii) sampling the demodulated data to obtain data samples, and wherein the determining of a set of received data levels from the received data comprises sorting the samples into clusters and determining each received data level of the set of received data levels from a corresponding sample cluster.

23. The method of claim 22 wherein the determining of each received data level of the set of received data levels from a corresponding sample cluster comprises determining centroids of the sample clusters.

24. The method of claim 19 wherein the data levels are slice levels.

* * * * *